United States Patent [19]

Tomozawa

[11] 3,979,701

[45] Sept. 7, 1976

[54] NON-RECURSIVE DIGITAL FILTER EMPLOYING SIMPLE COEFFICIENTS

[75] Inventor: Atsushi Tomozawa, Gaithersburg, Md.

[73] Assignee: Communications Satellite Corporation (Comsat), Washington, D.C.

[22] Filed: June 17, 1975

[21] Appl. No.: 587,774

[52] U.S. Cl. .............................. 333/70 T; 235/156; 328/167; 333/28 R
[51] Int. Cl.² ......................................... H03H 7/28
[58] Field of Search ...................... 333/70 T, 28 R; 235/152, 156, 164; 328/167

[56] References Cited
UNITED STATES PATENTS

| | | |
|---|---|---|
| 3,829,798 | 8/1974 | Byram et al. ........................ 33/70 T |
| 3,860,892 | 1/1975 | Speiser et al. .................. 333/28 R X |
| 3,906,400 | 9/1975 | Gooding et al. ................ 328/167 X |
| 3,914,588 | 10/1975 | Nussbaumer ....................... 235/156 |

*Primary Examiner*—Eugene La Roche
*Attorney, Agent, or Firm*—Sughrue, Rothwell, Mion, Zinn and Macpeak

[57] ABSTRACT

A non-recursive digital filter is disclosed, composed of a cascaded plurality of basic sections, each of which is characterized by coefficient values of integer powers of two's. No hardware multipliers are required in the filter and the operating speed is several times faster than other filters which utilize multipliers.

6 Claims, 6 Drawing Figures

(A) TYPE 1

(B) TYPE 2

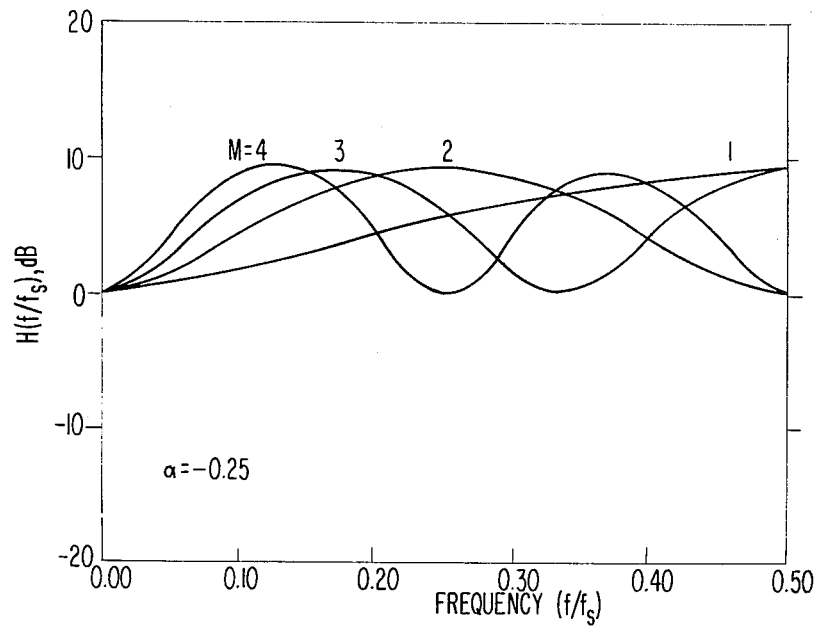
FIG.3
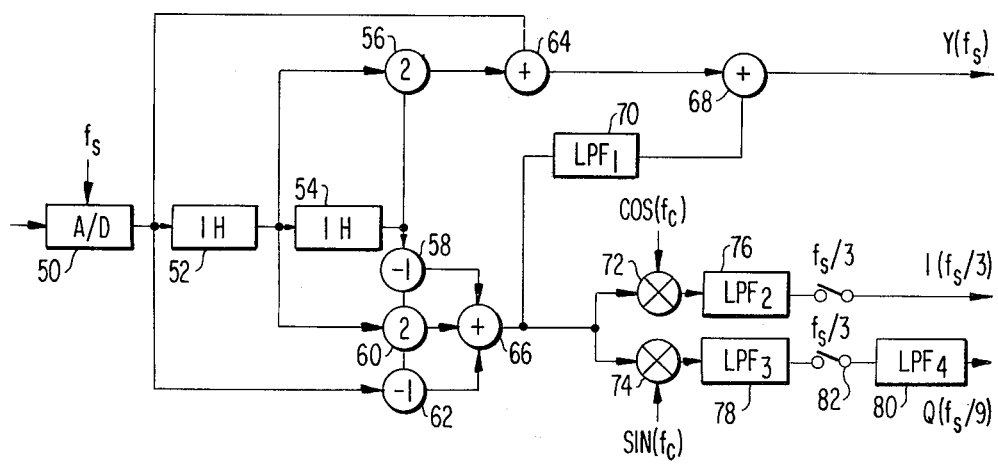
FIG.5
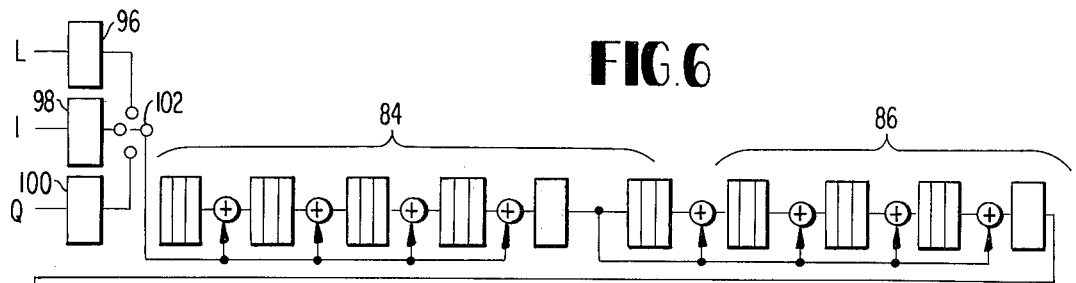
FIG.6
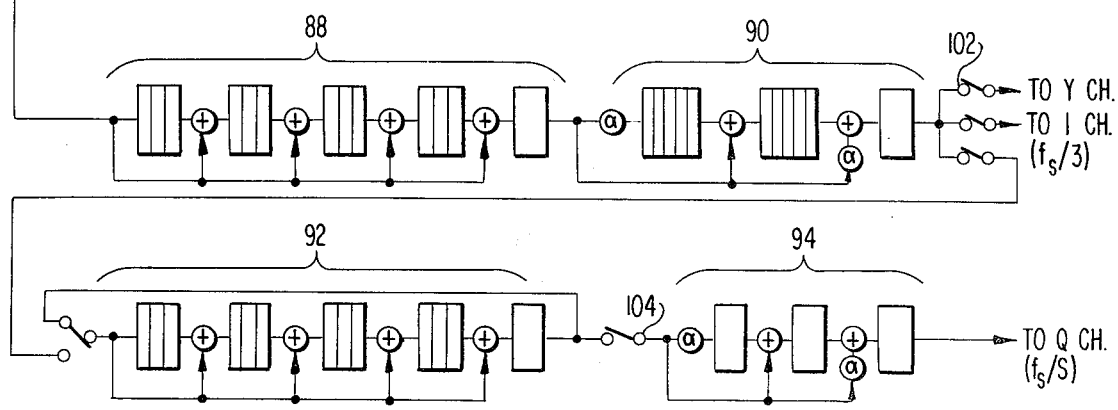

NON-RECURSIVE DIGITAL FILTER EMPLOYING SIMPLE COEFFICIENTS

BACKGROUND OF THE INVENTION

1. Field of the Invention

This invention is in the field of non-recursive digital filters used for digital processing of signals such as speech and video.

2. Prior Art

Digital filters process information by performing a predetermined set of arithmetic operations on digitally coded samples of that information. In conventional digital filters the information to be processed is sampled at a constant rate and each sample converted to a digital word usually consisting of a number of binary digits. Signals representative of these digitally coded samples are then applied to the digital filter at the sampling rate, the reciprocal of which is the sampling interval. A general background discussion of digital filters and their applications is found in Gold and Rader, "Digital Processing of Signals", McGraw-Hill Book Co., 1969.

Among the advantages of digital filters as signal processing devices is the fact that one such filter can be used to process data from several sources or channels simultaneously. This is generally accomplished by applying samples from each of the sources to the filter in a predetermined sequence, for example by time division multiplexing (TDM). Each delay unit is extended to provide capacity for the simultaneous storage of one sample from each source. If the filter coefficients remain constant, data from all sources will be subjected to the same filter function. By providing several sets of filter coefficients, it is possible to process data from each source using a different transfer function. Other than extending the capacity of the delay units, no other changes in filter configuration are necessary or necessitated by multiplexing.

The complexity of the digital transfer function or functions to be obtained determines the complexity of the required filter network. Hence, the more complex the transfer functions, the more delay units and signal paths are required in the filter. Since such a filter will in general include two adders, each of which must be capable of forming the sum of a plurality of simultaneously applied digital words corresponding in number to the number of delay units in the filter, the complexity of these adders is directly dependent on the complexity of the filter functions to be realized.

One such class of digital filters is known as non-recursive filters, that is those with only feed forward signal paths or taps. Non-recursive filters are unique in that the phase and frequency responses of such filters can be independently specified. A typical conventional non-recursive filter is composed of a tapped delayed element which in general consists of cascaded registers, multipliers and an adder. At each tap location there is a multiplier which multiplies the tap output with a coefficient and delivers the product to the adder. The input signal which is a series of sampled values appearing at a constant sampling rate is applied to the output of the tapped delay element. The output is obtained at the successive adder output and is delivered elsewhere for successive processing at the same sampling rate. Coefficient values are selected by design to give the desired filter transfer function and correspond to the sample values of the impulse response of the filter.

Frequently, non-recursive filters must include a relatively large number of feed forward signal paths. Hence, although the first or feedback adder of the general filter configuration as discussed above is entirely absent from a non-recursive filter network, the remaining adder (i.e., the second or feed forward adder) must often be exceedingly complex being required to form a sum of from 30 to 50 simultaneously applied signal quantities. Since only one filter cycle can be allowed for formation of this sum, the complexity of the required adder may limit the speed at which the filter can be made to operate. For this reason, the conventional non-recursive digital filter requires very fast multipliers to accommodate the necessary designed speed. Additionally, the number of multiplications and additions must be equal to the order of the filter. In a system such as commercial TV signal processing, where the output must be produced at least every 100 nanoseconds, utilization of non-recursive filters has not been considered practical because of the limited speed of available multipliers. Also, because of the speed requirement, each multiplication would demand dedicated hardware and a filter could not be built within reasonable limits of hardware cost. Also, the most efficient adders are neither readily adaptable to a variety of uses nor can filters employing such adder configuration be constructed of standardized subunits or modules. Attempts to overcome these inherent deficiencies in non-recursive adders in order to make them commercially viable are known in the prior art. U.S. Pat. No. 3,665,171 is typical of one such attempt in which the delay units in a non-recursive digital filter are selectively altered and additional elements comprising alternating series of two-input adders and partial sum delay units are used to perform the required addition of weight signal sampling. The interposition of these devices eliminates the large adder which is a salient feature of prior art non-recursive filter units. However, this patent still relies heavily on the use of multipliers in the filter circuit. Similarly, the patent to Jackson, U.S. Pat. No. 3,537,015 discloses a method of reducing the number of multiplier circuits in a digital phase equalizer but not the concept of the elimination in toto of these elements. In the Jackson patent, a reordering of the summing and multiplying operations reduces the number of required multiplier circuits in the filter.

SUMMARY OF THE INVENTION

It is apparent that the prior art non-recursive filter relied to a great extent on the use of multipliers notwithstanding the inherent deficiencies and disadvantages of these elements. The non-recursive digital filter of this invention is however composed of a cascaded plurality of basic sections, each of which is characterized by coefficient values of integer powers of twos such as $\pm 1, \pm .5, \pm .25$, etc. In binary arithmetic, multiplication with an integer twos' power is simply made by assigning a different weight to each bit (shifting) and hence no multiplier hardware is required for the filter. Hence, it is a first object of this invention to provide a non-recursive digital filter in which no multipliers are required.

It is a second object of this invention to provide a non-recursive digital filter in which the operating speed, generally set by adders prohibits a more efficient and faster mode of operation than is possible in prior art filters using multipliers.

It is still another object of this invention to provide a non-recursive digital filter at less cost and greater reliability than available in systems using multiplier circuits. Still another object of this invention is to provide for a non-recursive digital filter having direct application in fields such as television signal processing and satellite communications signal processing where prior art non-recursive filter systems have not found practical application.

Other features and objects of this invention, its nature and various advantages will be more apparent upon consideration of the attached drawings, wherein like elements are similarly numbered and the following detailed description of the invention.

BRIEF DESCRIPTION OF THE DRAWINGS

FIG. 3 is a diagram showing the Amplitude Frequency responses of the basic Type 2 section of FIG. 1;

FIG. 5 is a schematic block diagram of the color decoder to which this invention may be applied; and FIG. 6 is a block diagram of the digital filter complex utilizing principals of this invention.

DETAILED DESCRIPTION OF THE INVENTION

Figure 1:
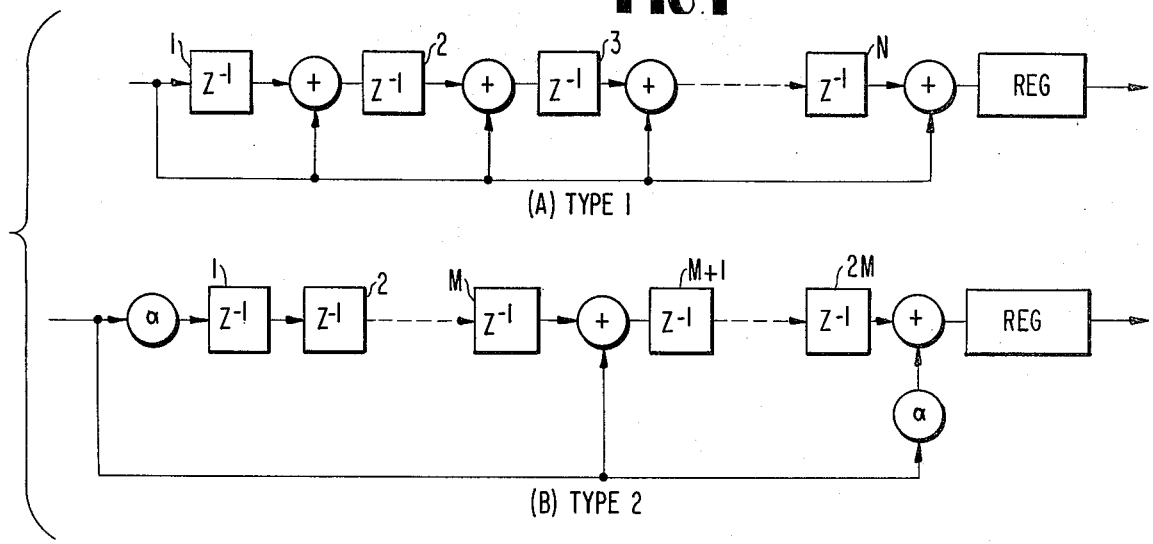
FIG. 1 is a block diagram of the two types of basic sections upon which non-recursive filters having the desired transfer characteristics are obtained by cascading plural sections.

Referring now to FIG. 1, the two basic types of sections utilized in the construction of a non-recursive filter made in accordance with the operating principles of this invention are shown. In FIG. 1A, a first type denoted Type 1 having an order N is shown and in FIG. 1B, a second type denoted Type 2 of an order 2M is shown. The particular order of a section in either FIG. 1A or 1B is equal to the number of delay elements in the section. As utilized in conventional logic diagrams, the boxes with $Z^{-1}$ are indicated as delay elements such as registers or delay lines conventionally known and used in the art. The circles with plus signs inside denote adders. With reference particularly to FIG. 1A, the Type 1 section shown therein is characterized by N delay elements having a coefficient value of 1 for all taps. The operative configuration of the Type 1 section is such that there is no feedback loop in the section and the impulse input value is successively added at each adder to the accumulated delay value of the signal as it appears at the output of each delay element. The output of the Type 1 section is conventionally fed into a register denoted REG in FIG. 1A and is utilized in a manner to be discussed in detail herein. The K distributed adder structure of the Type 1 section enables the highest speed of operation, since there is only one addition between registers. The last register, REG, does not contribute to the filter characteristics other than providing for extra delay, but it prevents data from propagating through multiple adders when several basic sections are cascaded.

Figure 2:
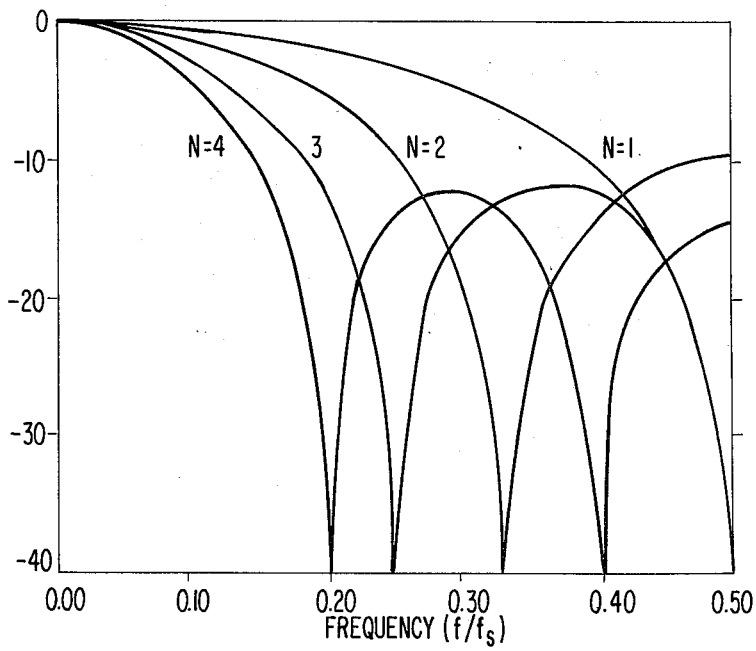
FIG. 2 is a diagram showing the Amplitude Frequency responses of the basic Type 1 section of FIG. 1.

The Type 2 section comprises additional elements in the form of multipliers shown in FIG. 1B as circles having the letter alpha which are used to multiply the input signal with a fixed coefficient of value alpha. Generally, this value is an integer power of 2. The Type 2 section as shown in FIG. 1B is characterized by two M delay elements and three coefficients, one of which is a 1 and the others are alpha which is as already noted an integer power of 2 such as ± ½, ± ¼—. A non-recursive filter having desired transfer characteristics is obtained by cascading plural sections of Type 1 and Type 2 elements shown in FIG. 1. The order of each constituent section may be the same as, or different from, those of the other sections. Generally, cascaded Type 1 sections will be used to create out of band loss of the desired amount and Type 2 sections will be added to modify the in-band transfer characteristics. As shown in FIG. 2, the Amplitude Frequency responses for several different orders of Type 1 sections is portrayed.

The impulse response of section Type 1 is $(n+1)$ consecutive impulses of unitary amplitude. The transfer function in Z is, $$H(Z) = \sum_{i=0}^{n} Z^{-i}$$

where $n$ is the order of this section.

The transfer function in terms of frequency is:

$$H\left(\frac{f}{fs}\right) = \left\{1 + 2 \sum_{i=1}^{K} \cos\left(2\pi \frac{if}{fs}\right)\right\} \cdot \exp\left(\frac{-jn}{2fs}\right)$$

when $n$ even ($n = 2K$), $fs$ = sampling freq.

$$H\left(\frac{f}{fs}\right) = \left\{2 \sum_{i=1}^{K} \cos\left[\frac{\pi(2i-1)f}{fs}\right]\right\} \cdot \exp\left(\frac{-jn}{2fs}\right)$$

where $n$ odd ($N=2K+1$)

$fs$ = sampling freq.

The impulse response of a Type 2 section is composed of one main response of unitary amplitude and two secondary responses of amplitude $a$, separated by M clock intervals. The transfer function of this type section can be expressed as $$H(Z) = \alpha + Z^{-m} + \alpha Z^{-2m}$$

where $$\alpha = \pm 2^{-k}$$

and the transfer function in frequency is given by:

$$H\left(\frac{f}{fs}\right) = \left\{1 + 2\alpha \cos\left(\frac{2\pi mf}{fs}\right)\right\} \cdot \exp\left(\frac{-jm}{fs}\right)$$

Different transfer characteristics can be obtained by changing the order and the tap coefficient $\alpha$. Examples of the amplitude transfer characteristics of the Type 2 sections are shown in FIG. 3 for several different orders with $\alpha$ fixed at $-0.25$.

The general properties of these two types of sections can be summarized as follows:
1. All sections have linear phase.
2. The delay time of the Type 1 section is $n/2fs$. Therefore, an even-ordered section has an integer delay with respect to the sampling interval.
3. The DC gains of Type 1 and Type 2 sections are $(n+1)$ and $(1+2\alpha)$, respectively. Hence, for $n=1, 3, 7 \ldots$, the DC gains of Type 1 sections are 2, 4, 8, all integer powers of two. For Type 2 sections, if $\alpha=-0.25$, the DC gain is 0.5.
4. As shown in FIG. 2, the loss characteristics of the Type 1 sections are roughly "equiripple". The minimum loss is about 10dB for $n=1$ and gradually increases with increasing order.

Figure 4:
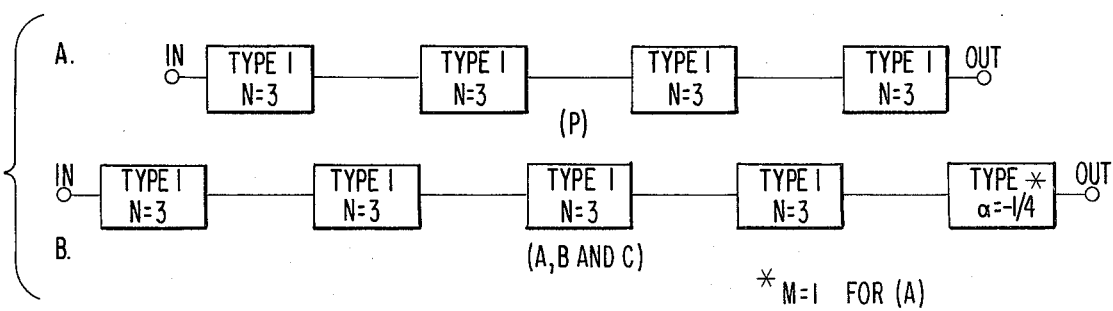
FIG. 4 shows a block diagram of two examples of a cascaded structure embodying the sections of FIG. 1.

Utilizing these characteristics a higher order filter can be synthesized by simply cascading several basic sections. The resultant transfer function is the product of the transfer functions of the constituent sections. Referring briefly to FIG. 4, several examples of cascaded structures for a family of low pass filters is shown. In FIG. 4A, four Type 1 sections of the third order are used as a base for the filter and as shown in FIG. 4B, four Type 1 sections of the third order are cascaded with one Type 2 section to generate different transfer characteristics. The low pass filters as typified in FIGS. 3A and 3B have as an operative limit only the progration delay of the adder. Therefore, if adders of sufficient speed are available various levels of time sharing may be used for resultant hardware savings.

One possible application of digital filtering is in color decoding and in particular the digital NTSC decoder. The basic scheme for decoding the NTSC composite signal is based on the use of a comb filter described by L. S. Golding in "DITEC, a Digital Television Communication System for Satellite Links", Second International Conference on Digital Satellite Communications, November 1972, pp. 384–397. FIG. 5 shows a block diagram of the digital NTSC decoder. The input to the A/D converter 50 is the NTSC composite signal which is sampled at the sampling frequency, $fs$. This sampling frequency is an integer multiple of the horizontal frequency $f_h$. The encoded signal is passed through two digital delay lines, 52, 54, each having an equivalent delay on one horizontal line interval, $1/f_h$. The delay lines 56–62 and associated adders 64–68 form the comb filter which delivers two output signals, one from adder 68 for the luminance channel and the other from adder 66 for the chrominance channel. The transfer characteristic of the luminance channel is such that the gain is maximum at integer multiples of the horizontal frequency and zero at odd multiples of half of the horizontal frequency. The low frequency components of the chroma channel are filtered out by low pass filter 70($LPF_1$) and added by adder 68 to the luminance signal to restore the constant amplitude characteristic of the luminance signal in the low frequency region. This composite signal appears as output $Y(fs)$.

The transfer function of the chrominance channel is complementary to that of the luminance channel. The chroma signal is demodulated by multiplying the chroma subcarrier at multipliers 72 and 74 by the functions of the carrier frequency, $fc$ and suitable filtering. The in-phase component (I signal) is obtained as an output of low pass filter 76($LPF_2$). The quadrature component (Q signal) is extracted by cascading two filters 78($LPF_3$) and 80($LPF_4$). Low pass filter 78 suppresses all unwanted frequency components beyond the frequency $fs/6$. By means of switch 82, low pass filter 80 operates at one-third of the system sampling frequency and further reduces the passband to approximately $fs/18$. Further details on the operation of this decoder are found in the above cited reference.

FIG. 6 shows the details of the actual implementation of the filter network of FIG. 5 according to the principles of this invention. The filter design for the four low pass filters, $LPF_1$–$LPF_4$ is composed of six units of basic sections, 84–94 and the use of the same filter design permits different paths to time share one set of filter hardware. The outputs of the chroma channel comb filter (2) 96, the in-phase component (I), 98, and the quadrature component (Q) 100, are time multiplexed at the filter input by means of switch 102, to form a single data stream $3fs$. Three registers in section replace each delay element of the basic structure to provide isolation between channels to store intermediate results separately and the adders are shared between channels. Sections 84, 86 and 88 operate three times faster than the system sampling rate. Section 90 could be realized in a straightforward manner by placing nine registers, operating at $3fs$ between adders. However, in this embodiment an attempt has been made to further reduce hardware. The outputs of $LPF_2$ and $LPF_3$ are sampled at $fs/3$ and since the delay time for the last section happens to be three sampling intervals, it is possible to sample the output of section 88 first at $fs/3$ and to perform the function of the last section at the $fs/3$ rate yet still obtain the same results. Hence, only one register per stage is necessary. Although the I and Q channels can be processed in this way, the L channel must operate at $fs$. Five registers are used per stage, three for the L channel and one each for the I and Q channels. The shift clock, not shown, occurs five times within three system sampling intervals and it is most convenient to use a $3fs$ clocks and delete four pulses out of nine. Switch 102 is used to gate output signals to the Y and I channels and input to section 92 to realize a portion of the low pass filtering of $LPF_4$. In section 92 the data recirculates three times through a single time-shared section. The output of section 92 is gated via switch 104 to section 94 which operates on the same principles as section 90.

Each particular section is designed to meet the following characteristics:
a. a loss of more than 26 dB beyond one-sixth of the sampling frequency;
b. a loss of more than 40 dB in the frequency range $0.35\,fs$ to $0.4\,fs$, decreasing to 26 dB at $0.25\,fs$ and $0.5\,fs$; and
c. a passband which is as wide and flat as is practical. The design is begun by examining the stopband characteristics of Type 1 sections and finding the best combination to meet the objective. Two Type 1 sections of order 4 ($n=4$) would give a loss of 26 dB at $f=0.167$ (FIG. 2), but an insufficient loss at $f=0.35\,fs$ (32 dB compared to the objective of 40 dB). Three sections of $n=4$ would accommodate both objectives (39 dB at $f=0.167\,fs$ and 48 dB at $f=0.35\,fs$). It is advisable to start with extra loss because some portion of this loss will be consumed during in-band "shaping", which is the second step, performed by adding Type 2 sections with $m=1, 2, 3$ and $\alpha=-0.25$, one by one. The resultant transfer characteristics can be plotted for comparison with the objective. The selected design can be expressed as:

$$H(Z) = (1 + Z^{-1} + Z^{-2} + Z^{-3} + Z^{-4})^3 \cdot (-\tfrac{1}{4} + Z^{-3} - \tfrac{Z^{-6}}{4}).$$

This digital filter is an 18th-order filter and has a DC gain of 62.5, which is not a power of two. A multiplier would be necessary to achieve unitary gain, however, the use of the multiplier for scaling can be avoided by using only two sections which have DC gains of powers of two. One possible low pass filter which will nearly satisfy the objective is:

$$H(Z) = (1 + Z^{-1} + Z^{-2} + Z^{-3})^4 \cdot (-\tfrac{1}{4} + Z^{-2} - \tfrac{Z^{-4}}{4}).$$

The DC gain of this filter is $128(2^7)$, therefore, unitary gain can be obtained by shifting the binary point seven places up at the output.

The complete decoder, utilizing these sections has a high operating frequency of about 36 MHz for a sampling frequency of 12 MHz for video. This level of speed can be reliably obtained from the currently available ECL family. The entire filter complex uses 20 adders and about 70 registers.

While various embodiments of this invention have been disclosed and described, it is to be understood that various other embodiments may be devised by those skilled in the art without departing from the spirit and scope of the invention.

What is claimed is:

1. A non-recursive digital filter comprising:
 a. a first section of N delay elements, the coefficient value of all the taps of said delay elements being one;
 b. a second section of 2M delay elements, the coefficient value of all the taps of said delay elements being an integer power of two;
 c. said first section utilized for forming the desired loss characteristics of said filter and said second section utilized for shaping the passband of said filter; and
 d. said first and second sections operably coupled such that the resulting grouping has a tap coefficient of an integer power of two.

2. The apparatus of claim 1 wherein said section of N delay elements has an impulse response of (N+1) consecutive impulses of unitary amplitude where n is the order of the section and, wherein the transfer function in Z is:

$$H(Z) = \sum_{i=0}^{n} Z^{-i}.$$

3. The apparatus of claim 2 wherein said section of 2M delay elements has an impulse response comprising of one main response of unitary amplitude and two secondary responses of amplitude $\alpha$, separated by m clock intervals, before and after the main response, and wherein the transfer function in Z is:

$$H(Z) = \alpha + Z^{-m} + \alpha Z^{-2m},$$

where $\alpha = \pm 2^{-k}$, k being a constant.

4. The apparatus of claim 3 wherein the DC gain for said section of N delay elements is (N+1) and the DC gain for said section of 2M delay elements is $(1+2\alpha)$.

5. The apparatus of claim 4 wherein the transfer function in frequency of said first section of N delay elements is:

$$H\left(\frac{f}{f_s}\right) = \left\{1 + 2 \sum_{i=1}^{K} \cos\left(2\pi \frac{if}{f_s}\right)\right\} \cdot \exp\left(\frac{-jn}{2f_s}\right)$$

where $f_s$ is the sampling frequency and N is an even integer (N=2k).

6. The apparatus of claim 4 wherein the transfer function in frequency of said first section of N delay elements is:

$$H\left(\frac{f}{f_s}\right) = \left\{2 \sum_{i=1}^{K} \cos\left[\frac{\pi(2i-1)f}{f_s}\right]\right\} \cdot \exp\left(\frac{-jn}{2f_s}\right)$$

where $f_s$ is the sampling frequency and N is an odd integer (N = 2K+1).

* * * * *